United States Patent
Garbuzov et al.

(10) Patent No.: US 6,600,764 B1
(45) Date of Patent: Jul. 29, 2003

(54) HIGH POWER SINGLE MODE SEMICONDUCTOR LASER

(75) Inventors: Dimitri Zalmanovich Garbuzov, Mercer, NJ (US); Viktor Borisovich Khalfin, Highstown, NJ (US)

(73) Assignee: Trump Photonics Inc., Cranbury, NJ (US)

(*) Notice: Subject to any disclaimer, the term of this patent is extended or adjusted under 35 U.S.C. 154(b) by 0 days.

(21) Appl. No.: 09/585,032

(22) Filed: Jun. 1, 2000

Related U.S. Application Data

(60) Provisional application No. 60/176,913, filed on Jan. 20, 2000.

(51) Int. Cl.[7] .................................................. H01S 5/00
(52) U.S. Cl. ............................................ 372/46; 372/45
(58) Field of Search .............................. 372/46, 45, 50

(56) References Cited

U.S. PATENT DOCUMENTS

| | | | | |
|---|---|---|---|---|
| 5,003,550 A | * | 3/1991 | Welch et al. | 372/50 |
| 5,652,812 A | * | 7/1997 | Gurib et al. | 372/50 |
| 5,684,824 A | * | 11/1997 | Hayakawa | 372/103 |
| 5,687,272 A | * | 11/1997 | Vinchant et al. | 372/50 |
| 5,878,070 A | * | 3/1999 | Ho et al. | 372/92 |
| 6,014,396 A | * | 1/2000 | Osinski et al. | 372/46 |
| 6,104,738 A | * | 8/2000 | Kitoh et al. | 372/46 |
| 6,174,748 B1 | * | 1/2001 | Jeon et al. | 438/31 |

* cited by examiner

*Primary Examiner*—Paul Ip
*Assistant Examiner*—James Menefee
(74) *Attorney, Agent, or Firm*—Fish & Richardson P.C.

(57) ABSTRACT

A single-mode semiconductor diode laser includes a single-mode section, a tapered mode-transformer section coupled to the single-mode section, and a power-supply section coupled to the tapered mode transformer section. The power-supply section has a second width larger than the width of the single-mode section. The tapered mode-transformer section is characterized in that optical energy from said single-mode section adiabatically couples to the power-supply section through the mode-transformer section.

26 Claims, 4 Drawing Sheets

HIGH POWER SINGLE MODE SEMICONDUCTOR LASER

This application claims priority to provisional application No. 60/176913, filed on Jan. 20, 2000, which is incorporated herein by reference.

FIELD OF THE INVENTION

The present invention relates to semiconductor diode lasers. In particular, the present invention relates to high-power single-mode semiconductor diode lasers.

BACKGROUND

Many technologies employ single-mode high-power lasers. For example, erbium doped fiber amplifiers (EDFAs) use single-mode high-power pump lasers for optimal amplification of optical signals across optical fibers. Unfortunately, producing single-mode laser radiation is not always compatible with emitting laser radiation at high power. One of the reasons for this involves the width of the laser cavity. Single-mode radiation can be produced in a relatively narrow cavity, but the small size of the cavity limits the power output. If the cavity width is increased, thereby increasing the power output, multiple modes are produced.

FIG. 1 displays five known types of single-mode laser diodes, all of which exhibit varying degrees of strengths and weaknesses. For example, straight active region 101, which can be implemented in a ridge configuration or a buried configuration, is inexpensive and reliable. This configuration, however, incurs catastrophic optical damage when used to create 0.98 μm radiation, and it leads to power saturation when used to create 1.48 μm radiation. Thus, the configuration shown in 101 has inherent power limitations. Additionally, this configuration produces a highly divergent elliptical beam.

Master oscillator power amplifier (MOPA) 102 has a straight active region with a tapered output. This configuration can produce single-mode radiation at high power. It exhibits problems, however, in that it is complex to fabricate, has relatively low efficiency, and produces a highly-divergent beam with current-dependent astigmatism.

Unstable-cavity taper-emitting diode laser 103 exhibits a relatively high continuous-wave power. This configuration, however, has a high vertical and lateral divergence, and produces a highly divergent beam with current-dependent astigmatism. This configuration also exhibits a relatively low efficiency.

Diode laser with integrated beam expander 104 produces a low-divergence, non-astigmatic output beam. Unfortunately, the twin-waveguide structure exhibited in the figure is difficult to produce. In addition, this configuration exhibits additional losses and a decrease in output power.

Alpha-DFB laser 105 exhibits a very high single-mode power output. This configuration, however, is difficult to fabricate. Additionally, this configuration has a differential efficiency 25–30% less than for conventional laser diodes. Finally, this configuration emits beams with a relatively high beam divergence.

In general, those known apparatuses that include a narrow section and a tapered section (e.g., MOPA 102 and unstable cavity 103) do not allow for adiabatic coupling from the narrow part of the device to the tapered section. Without adiabatic coupling, additional modes are created. Furthermore, any time the coupling is nonadiabatic, the output beam's lateral divergence depends only on the width of the narrowest part of the device; the lateral divergence can be as great as that for the straight active region devices, 105. Finally, these known devices exhibit current-dependent astigmatism.

Thus, a laser is needed that is relatively simple to fabricate, and that produces single-mode high-power radiation with a wide active region and a low beam divergence.

SUMMARY OF THE INVENTION

To alleviate the problems in the known art, an apparatus is provided that produces single-mode high-power laser light. In one embodiment of the present invention, a single-mode semiconductor diode laser comprises a single-mode section with a first width $S_0$ that satisfies the equation $S_0 < \lambda (8 \Delta n \, n)^{-1/2}$, a tapered mode-transformer section coupled to said single-mode section, and a power-supply section coupled to said tapered mode transformer section. The power-supply section in this embodiment has a second width larger than the first width. Additionally, the tapered mode-transformer section is characterized in that optical energy from the single-mode section couples adiabatically to the mode-transformer section and then to the power-supply section.

DETAILED DESCRIPTION

Embodiments of the present invention include single-mode lasers that generate a relatively high power output. In general, embodiments of the present invention include a section that adiabatically couples single-mode laser light to a power-supply section where the laser's output power is increased above that of laser's that do have a power-supply section.

Figure 1:
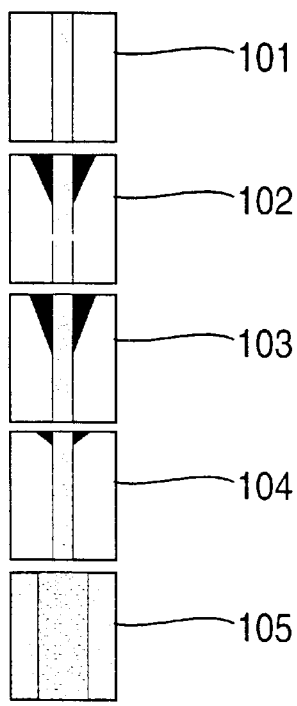
FIG. 1 is a schematic diagram of various known single-mode pumping diode lasers.
Figure 2:
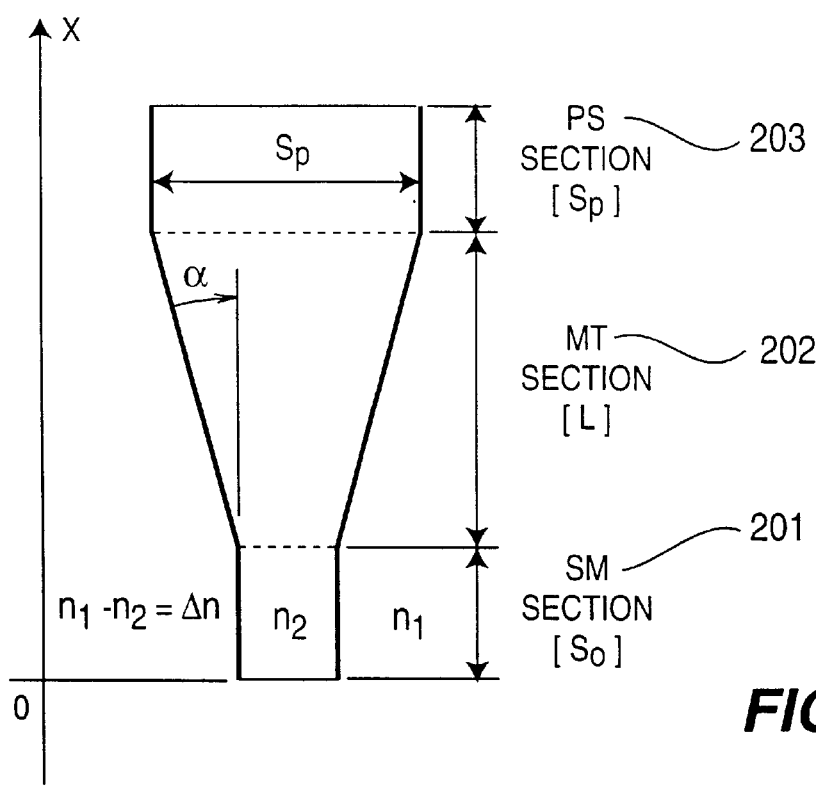
FIG. 2 is a schematic diagram of a top view of an embodiment of the present invention.

FIG. 2 is a schematic diagram of a top view of an embodiment of the present invention. In this embodiment, single-mode section 201 is coupled to mode transformer section 202, and mode-transformer section 202 is coupled to power-supply section 203. The three sections are designed to have specific characteristics that provide in combination single-mode high-power output light.

With regard to single-mode section 201, single-mode section 201 is a single-mode section of semiconductor laser that is narrow relative to the other parts of the laser. For example, single-mode section 201 can be an InP-based laser section with a lateral width of 1–4 μm that emits single-mode light at 1.48 μm. Alternatively, for example, single-mode section 201 can be a GaAs-based laser section with a lateral width of 1–3 μm, and that emits single-mode light at 0.98 μm. In general, the width $S_0$ of single-mode section 201 should satisfy the single-mode condition $S_0 < \lambda (8 \Delta n\, n_1)^{-1/2}$, where $\Delta n$ is the refractive index step at the lateral active region boundaries, and $n_1$ is the refractive index in the active region at wavelength $\lambda$.

Single-mode section 201 has a refractive index $n_2$ higher than the refractive index $n_1$ in the adjacent unpumped chip areas. The difference $n_2-n_1$, called $\Delta n$, in one embodiment of the present invention should be at least approximately 0.01.

Mode transformer section 202 has a length L, and a variable width that is measured by taper angle α, as shown in FIG. 2. The width of mode-transformer section 202 is narrowest at the point where it couples to single-mode section. 201, and widest where it couples to power supply section 203.

Mode-transformer section 202 is characterized in that radiation produced in single-mode section 201 is adiabatically coupled into and adiabatically propogates in mode-transformer section 202. To couple the radiation adiabatically from single-mode section 201 into the power-supply section, taper angle α, in one embodiment of the present invention, can be chosen such that the single-mode radiation from single-mode section 201 is coupled adiabatically into power-supply section 203. For the purposes of the present invention, the term "adiabatically," and its grammatically-related forms, Means that no substantial losses occur due to reflection at the boundaries between the sections, or due to any other interactions at the interface, or due to creation of additional modes. Thus, when laser light from single-mode section 201 is coupled into power supply section 203 through mode-transformer section 202, the near-field distribution of radiation is increased without increasing the number of transverse modes in the laser cavity.

Power-supply section 203, coupled to mode-transformer section 202, is used to increase the device's output power. The device's output power is proportional to the current that can be supplied to the device, and the maximum current is proportional to the total device area shown, for example, in FIG. 2. Thus, power-supply section 203 increases the power output of the laser by increasing the total active device area.

Figure 3:
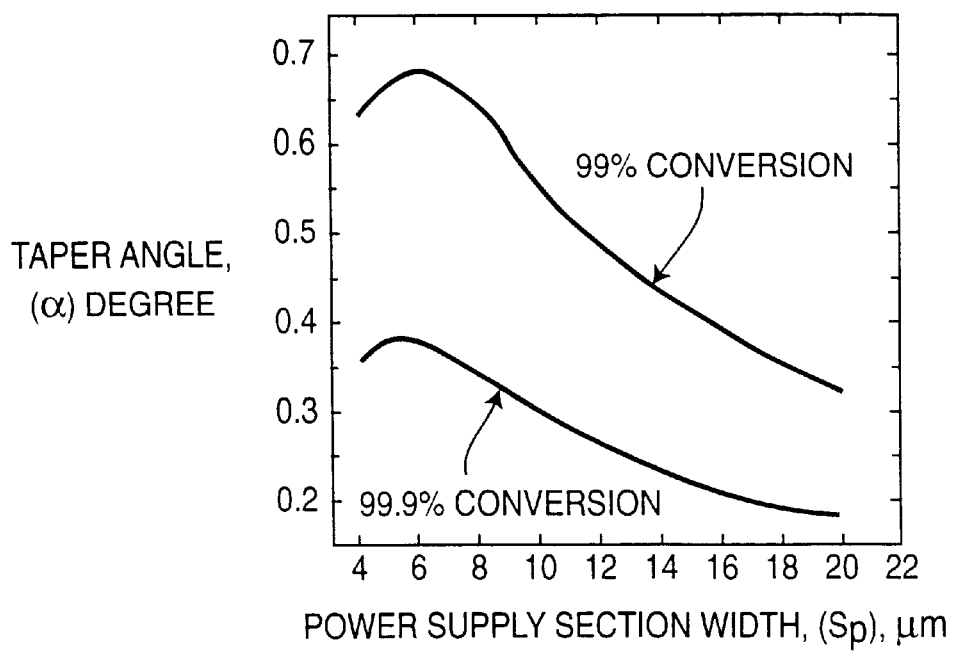
FIG. 3 is a graph of taper angle as a function of power-supply section width, for two given coupling efficiencies.
Figure 4:
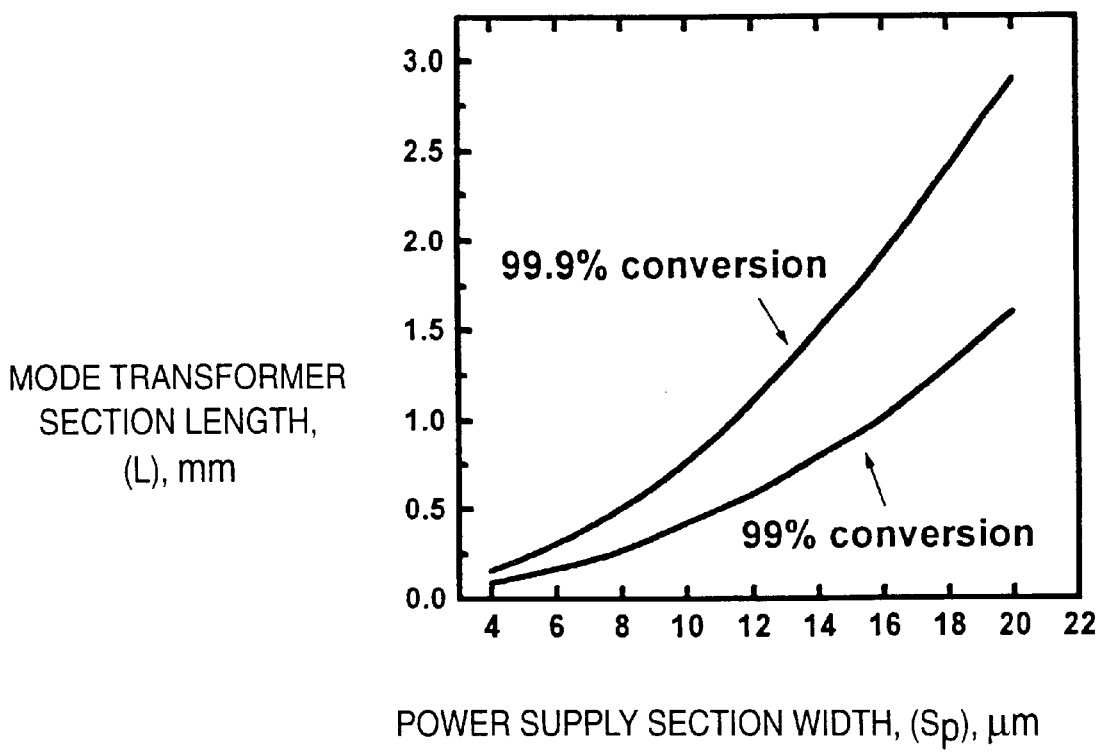
FIG. 4 is a graph of mode-transformer-section length as a function of power-supply section width, for two given coupling efficiencies.

FIGS. 3 and 4 display the relationship between the physical characteristics of embodiments of the present invention for fixed transformation efficiency $\eta_t$. Transformation efficiency $\eta_t$ is used as the transformation coefficient for the zero mode, and is defined as the ratio of zero-mode power in the single-mode section to the zero-mode power in the power supply section. To increase the width $S_p$ of power-supply section 203 without degrading the transformation efficiency coefficient $\eta_t$, length L of the mode-transformer section cannot be merely increased while keeping taper angle α constant. Rather, to support $\eta_t$ at a fixed level, α should decrease as $S_p$ increases. This is shown in FIGS. 3 and 4.

FIG. 3 shows the relationship between taper angle α and power-supply section width $S_p$. The calculations for this figure were performed for $\eta_t=99\%$ and $\eta_t=99.9\%$. The values of $S_0$ and $\Delta n$ were taken as 2 μm and 0.01, respectively. Note that varying the parameters $S_0$ and $\Delta n$ by approximately 1.5 times does not meaningfully effect the results represented in the graphs. These calculations do not depend on the specific material structure of the laser. Rather, the results depend only on the radiation wavelength and the effective refractive indices. The power difference that corresponds to $1-\eta_t$ in the graphs results from losses due to the transformation to additional modes that can propagate in the power-supply section, thereby causing wave front distortion. The calculations were performed using the well-known Beam Propagation Method (BPM) in the effective index approximation. As can be seen from FIG. 3, for a given $\eta_t$, after quickly peaking, taper angle α generally decreases as power-supply section width $S_p$ increases. The calculations that result in FIG. 3 assume a taper with a simple linear shape. If the shape of the taper changes, the results can change as well.

FIG. 4 shows the relationship between mode-transformer section length L and power-supply section width $S_p$. Again, for a given $\eta_t$, the mode-transformer section length L increases superlinearly with increasing power-supply section with $S_p$.

For $\eta_t=99.9\%$, the amplitude distortion of the wavefront is less than 10%, and the phase distortion is smaller than 0.1 rad. For $\eta_t=99\%$, on the other hand, the amplitude distortion increases to 30%, and the phase distortion increases to 0.3 Rad. Thus, to emit a substantially nonastigmatic beam from the power-supply section external facet, an $\eta_t=99.9\%$ is advantageous. In general, the higher the value of $\eta_t$, the lower the probability of creating additional modes. It should be appreciated that, to satisfy the conditions of a high $\eta_t$, the lasers should be relatively long (i.e., longer than 1 mm), and therefore the laser structures used for the device fabrication should have very low internal losses (on the order of <3 cm$^{-1}$).

Figure 5:
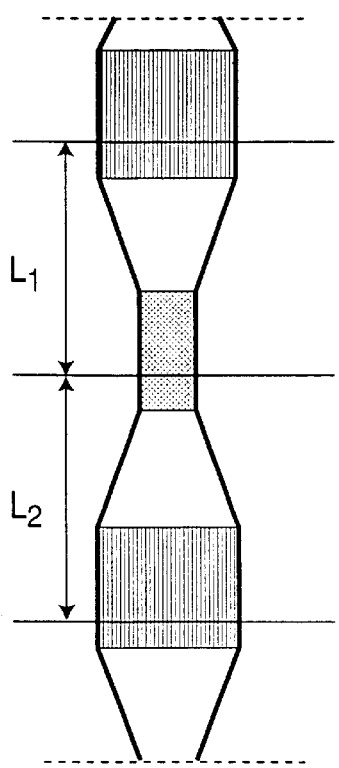
FIG. 5 is a schematic diagram of an embodiment of the present invention in which cavity length is shown to be optimized as a function of cleavage position.

The functional relationships displayed in FIGS. 3 and 4 are independent of the materials used, and are scaled with the wavelengths. Thus, to find the geometry of the mode-transformer section for devices with $\lambda$ different from $\lambda_0$, the values of L and $S_p$ should be scaled by a factor of $\lambda/\lambda_0$. The length of the single-mode section and the length of the power-supply section can be varied in the process of bar cleaving, shown in FIG. 5.

The length of the power-supply section depends on the losses in the device's epilayers. If losses are too high, the laser can be fabricated to limit the length of the power-supply section. The optimum length of the power-supply section can be chosen, in part, based on the value of the laser's internal losses. To keep the external efficiency high, internal losses should be less than effective output losses that are determined by the laser length, reflectivity of the output facet, and, in the high power regime, by the degree of saturation. Lasers with different power-supply-section lengths cleaved from a single wafer will have the same optical parameters and can be used for loss determination in finding the optimum length.

Figure 6:
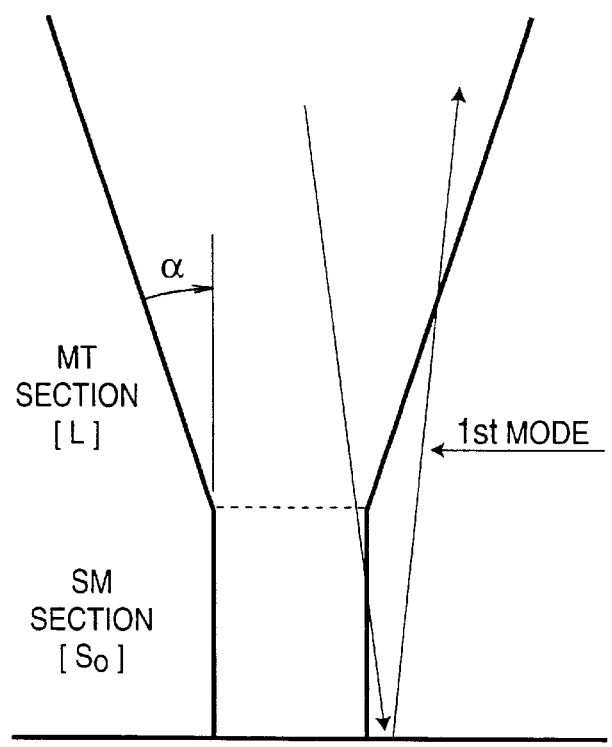
FIG. 6 is a schematic diagram demonstrating that the radiation not confined in the single-mode section can be returned to the waveguide of the single-mode section after reflection.

When power is supplied to the mode-transformer section, more than one transverse mode will be created. Under the proper circumstances, however, these additional modes will not couple into the single-mode section, and so will not provide feedback for lasing at these modes. FIG. 6 is a schematic diagram of an embodiment of the present invention that illustrates this phenomenon. In FIG. 6, it can be seen that the first mode (that is, the first nonzero mode) has a nonzero probability of reflecting off the chip facet and reentering the laser. This probability depends on the length of the single-mode section. The longer the section, the smaller the probability this will occur. Thus, the single-mode section can be used as a filter for the nonzero modes; the longer the single-mode section, the higher the probability that nonzero modes will be filtered out.

Figure 7:
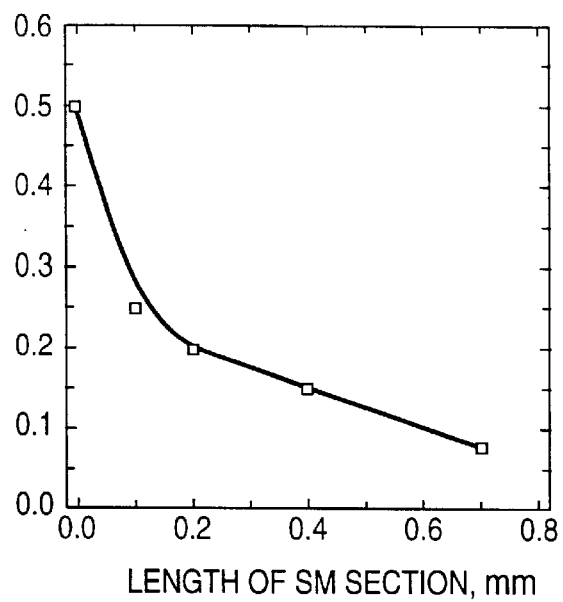
FIG. 7 is a graph of fiber mode coupling coefficient as a function of single-mode section length, according to an embodiment of the present invention.

FIG. 7 demonstrates the dependence of the first-non-zero-mode coupling coefficient $\chi$ on the length of the single-mode section. The $\chi$ values characterize the additional losses that result from producing the first non-zero mode. If $\chi$=0.15, then for the first non-zero mode the mirror losses are 85% higher than that for the zero-mode. After translating this difference in the reflectivity into the difference in the threshold gain for the fundamental and first nonzero mode, for the 2 mm laser cavity, approximately 5 cm$^{-1}$ has been obtained. This difference should be enough to sustain the single mode regime and prevent the generation of first non-zero mode. Thus, from FIG. 7, it follows that the length of the single-mode section should be, optimally, between 200–400 $\mu$m for full elimination of the non-zero modes.

The data in FIG. 7 were calculated for the specific parameters of the single mode and taper sections, with the same BPM approach as the other calculations. A length range of the single-mode section of approximately 200 to approximately 400 $\mu$m is sufficient for suppressing the first non-zero mode for the lasers that produce 0.98 $\mu$m and 1.5 $\mu$m radiation.

Using the three-section basic design, different configurations of pumping sources for lasers of wavelengths shorter than 1 $\mu$m and longer than 1 $\mu$m can be applied. The difference in lateral configuration follows from the difference in the mechanisms that limit output power for short and long wavelength lasers.

Figure 8:
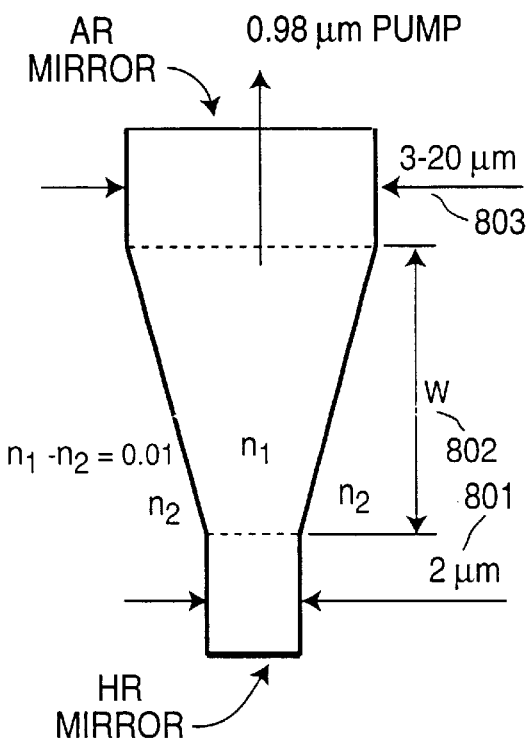
FIG. 8 is a schematic diagram of a top view of an embodiment of the present invention.

For short-wavelength GaAs-based lasers, output power is typically limited by the output power density at the front mirror facet. Because near-field intensity is much higher at the output mirror of a laser cavity than at the rear high-reflection mirror, performance can, in some embodiments, be improved by using an output side that is broader than the reflection side. FIG. 8 is a schematic diagram of a GaAs-based embodiment of the present invention. In this embodiment, the output radiation has a wavelength of 0.98 $\mu$m. Single-mode section 801 is 2 $\mu$m wide, and can be backed by a high-reflection coating. The width of power-supply section 803 can range from approximately 3 to approximately 20 $\mu$m, depending on length W and angle $\alpha$. Because output power in this embodiment is limited by catastrophic optical damage, the laser radiation is emitted from the wider power-supply section, which can be lined with an anti-reflective coating.

Figure 9:
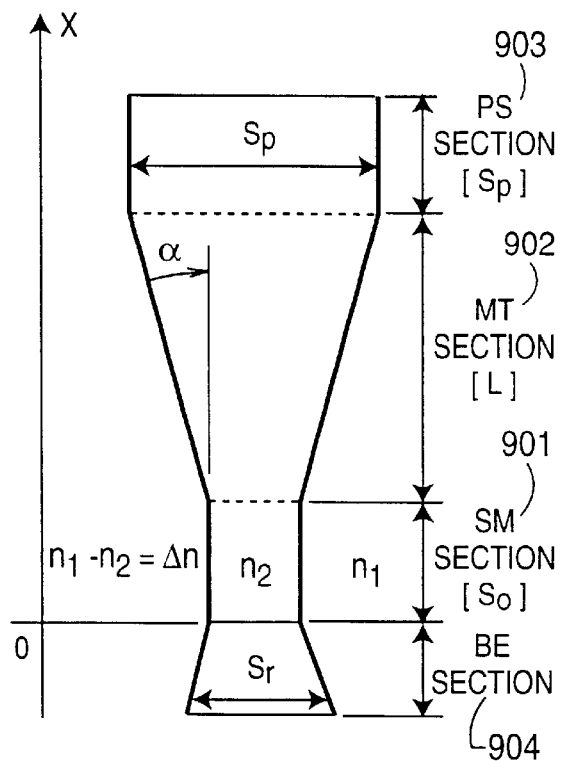
FIG. 9 is a schematic diagram of a top view of an embodiment of the present invention that includes a beam-expander section.

FIG. 9 is another embodiment of a GaAs-based embodiment of the present invention. In this embodiment, a beam expander 904 is coupled to single-mode section 901. With the beam expander, laser radiation can be emitted from the power-supply section output facet with diminished likelihood of incurring catastrophic optical damage at the high-reflective expander facet. To provide nearly equal optical power density at the reflecting and the emitting facet, the width of the reflective expander facet $S_{er}$ can be found from the relation:

$$S_{er} > 2 * S_{Out} * R^{0.5}$$

where R is reflectance at the output facet and $S_{out}$ is the width of the output facet. It is seen from this relation that the width of the reflecting facet is less than the width of the power supply output facet. If $S_{er}$ is smaller than $S_0$ the expander section is not required.

It should be appreciated by those skilled in the art that emitting the laser radiation from the power-supply section is not limited to GaAs-based embodiments. The discussion above is meant to illustrate an embodiment of the present invention for which catastrophic optical damage is an issue; GaAs-based lasers are discussed merely for ease of explanation.

Figure 10:
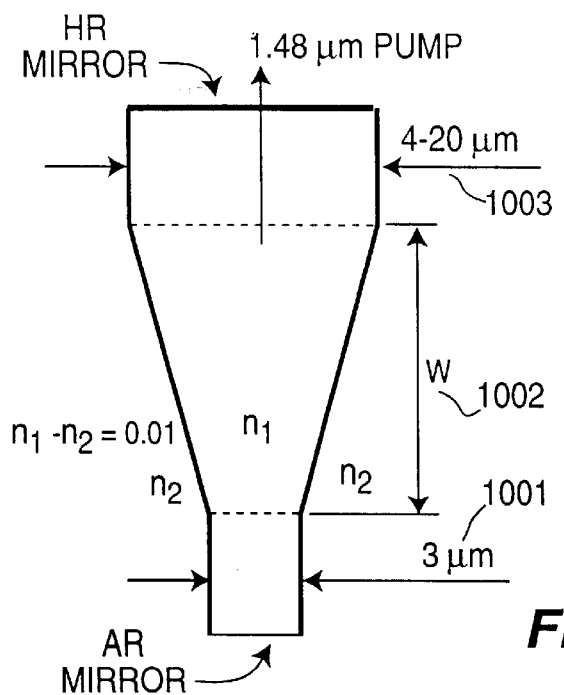
FIG. 10 is a schematic diagram of a top view of an embodiment of the present invention.

FIG. 10 is an embodiment of the present invention in which single-mode section 1001 includes an output side for emitting the laser light, and power-supply section 1003 includes a reflection side. In one embodiment, the apparatus can be an InP-based laser that emits light with a wavelength of 1.48 $\mu$m. InP-based lasers belong to the class of lasers for which output power is not so severely constrained by catastrophic optical damage. Thus, in the embodiment displayed in FIG. 10, single-mode section 1001 can include an output side for emitting the laser radiation from the laser cavity.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. For example, although GaAs-based and InP-based lasers are discussed, embodiments of the invention are not limited to these materials. Rather, embodiments of the present invention can be implemented using any materials practicable for making such lasers with the properties as described above.

What is claimed is:

1. A semiconductor diode laser operation at a wavelength $\lambda_0$, comprising:
    (a) a single-mode section having a first width $S_0$, a first length $L_0$, an index of refraction n at $\lambda_0$, and a refractive index step $\Delta$n at $\lambda_0$, wherein the width of $S_0$ satisfies an equation $S_0 < \lambda_0/(8*\Delta n*n)^{1/2}$;
    (b) a power-supply section having a second width $S_p$, wherein the width of $S_p$ satisfies an equation $S_p > \lambda_0/(8*\Delta n*n)^{1/2}$; and
    (c) a mode-transformer section coupled to the single-mode section and to the power-supply section, wherein the mode-transformer has a second length L, a first width $S_0$ where the mode-transformer section couples to the single-mode section, a second width $S_p$ where the mode-transformer section couples to the power-supply section, and a width that varies between $S_0$ and $S_p$ along the length L,
    wherein the length L and the second width $S_p$ are relationally selected to couple energy substantially adiabatically through the mode transformer section from the single-mode section to the power-supply section, and
    wherein the length $L_0$ is selected to be sufficiently long to substantially suppress all but a single mode of lasing in the semiconductor diode laser.

2. The semiconductor diode laser of claim 1 wherein $\tan^{-1}[(S_p-S_0)/2L] > 0.2$ degrees.

3. The semiconductor diode laser of claim 1 wherein $L_0$ is greater than about 200 microns.

4. The semiconductor diode laser of claim 1 wherein $L_0$ is greater than about 400 microns.

5. The semiconductor diode laser of claim 1, wherein the power-supply section includes an output side.

6. The semiconductor diode laser of claim 5, further comprising:

(d) a beam expander section coupled to a first side of the single-mode section wherein said mode-transformer section is coupled to a second side of the single-mode section, and wherein the output side of the power-supply section has a reflectance R and wherein the beam expander section has a width $S_{er}$ that satisfies a relation $S_{er} > 2*S_p*R^{0.5}$.

7. The single-mode semiconductor diode laser of claim 1 further comprising:

(d) a beam expander section coupled to a first side of said single-mode section, wherein said tapered mode-transformer section is coupled to a second side of said single-mode section and a second side of said beam expander has a width that satisfies the relation $S_{er} > 2*S_{Out}*R^{0.5}$.

8. The semiconductor diode laser of claim 1, wherein the semiconductor diode laser is GaAs-based.

9. The semiconductor diode laser of claim 1, wherein the semiconductor diode laser is InP-based.

10. The semiconductor diode laser of claim 1, wherein the second width $S_p$ is about 3 to about 20 times greater than the wavelength $\lambda_0$.

11. The semiconductor diode laser of claim 1, wherein the second width $S_p$ is about 5 to about 20 times greater than the wavelength $\lambda_0$.

12. The single-mode semiconductor diode laser of claim 9, wherein said first means for generating single-mode radiation includes an output side.

13. The semiconductor diode laser of claim 1, wherein $\lambda_0$ is selected from the group consisting of about 0.98 microns and about 1.48 microns.

14. A semiconductor diode laser comprising:

(a) a first means for guiding radiation of a wavelength $\lambda_0$, said first means having a first width ($S_0$), a first length $L_0$, an index of refraction n at $\lambda_0$, and a refractive index step $\Delta n$ at $\lambda_0$, wherein the width of $S_0$ satisfies an equation $S_0 < \lambda_0/(8*\Delta n*n)^{1/2}$;

(b) a second means for amplifying said radiation, the second means having a second width ($S_p$) that satisfies an equation $S_p > \lambda_0/(8*\Delta n*n)^{1/2}$; and (c) a third means for guiding the radiation coupled between the first means and the second means, the third means having a length (L), a first width $S_0$ where the mode-transformer section couples to the single-mode section, a second width $S_p$ where the mode-transformer section couples to the power-supply section, and a width that varies between $S_0$ and $S_p$ along the length, and wherein the length is selected in relation to the second width for coupling radiation substantially adiabatically through the third means from the first means into the second means, and wherein the length $L_0$ is selected to be sufficiently long to substantially suppress all but a single mode of lasing in the semiconductor diode laser.

15. The semiconductor diode laser of claim 14 wherein $\tan^{-1}[(S_p-S_0)/2L] > 0.2$ degrees.

16. The semiconductor diode laser of claim 14 wherein $L_0$ is greater than about 200 microns.

17. The semiconductor diode laser of claim 14 wherein $L_0$ is greater than about 400 microns.

18. The semiconductor diode laser of claim 14, wherein the second means includes an output side.

19. The semiconductor diode laser of claim 18, further comprising:

(d) a fourth means diminishing the radiation density coupled to a first side of the first means wherein the third means is coupled to a second side of the first section, and wherein the output side of the second means has a reflectance R and wherein the fourth means has a width $S_{er}$ that satisfies the relation $S_{er} > 2*S_{Out}*R^{0.5}$.

20. The semiconductor diode laser of claim 14, wherein the first means includes an output side.

21. The semiconductor diode laser of claim 14, wherein the semiconductor diode laser is GaAs-based.

22. The semiconductor diode laser of claim 14, wherein the semiconductor diode laser InP-based.

23. The semiconductor diode laser of claim 14, wherein the second width $S_p$ is about 3 times to about 20 times greater than the wavelength $\lambda_0$.

24. The semiconductor diode laser of claim 14, wherein the second width $S_p$ is about 5 times to about 20 times greater than the wavelength $\lambda_0$.

25. The semiconductor diode laser of claim 14, wherein the second width $S_p$ is about 8 to about 20 times greater than the wavelength $\lambda_0$.

26. The semiconductor diode laser of claim 14, wherein $\lambda_0$ is selected from the group consisting of about 0.98 microns and about 1.48 microns.

* * * * *